(12) United States Patent
Pan

(10) Patent No.: US 8,750,813 B2
(45) Date of Patent: Jun. 10, 2014

(54) METHOD AND SYSTEM FOR A DYNAMIC TRANSMISSION GAIN CONTROL USING A DEDICATED POWER AMPLIFIER DRIVER IN A RADIO FREQUENCY TRANSMITTER

(75) Inventor: Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1148 days.

(21) Appl. No.: 12/470,378

(22) Filed: May 21, 2009

(65) Prior Publication Data

US 2010/0297970 A1 Nov. 25, 2010

(51) Int. Cl.
*H04B 1/04* (2006.01)
*H01Q 11/12* (2006.01)

(52) U.S. Cl.
USPC ............................................... 455/127.2

(58) Field of Classification Search
USPC ........ 455/424, 425, 456.5, 456.6, 561, 550.1, 455/575.1, 102, 116, 118, 126, 552.1, 455/127.1; 375/238, 141, 297, 296, 295; 330/277
See application file for complete search history.

(56) References Cited

U.S. PATENT DOCUMENTS

| | | | |
|---|---|---|---|
| 4,222,068 A * | 9/1980 | Thompson | 380/222 |
| 6,175,746 B1 * | 1/2001 | Nakayama et al. | 455/552.1 |
| 6,337,974 B1 * | 1/2002 | Inamori et al. | 455/126 |
| 6,721,368 B1 * | 4/2004 | Younis et al. | 375/295 |
| 6,728,224 B1 * | 4/2004 | Kakizaki et al. | 370/313 |
| 6,970,496 B1 * | 11/2005 | Ben-Bassat et al. | 375/141 |
| 7,149,246 B1 * | 12/2006 | Adams et al. | 375/238 |
| 7,359,684 B2 * | 4/2008 | Bellaouar et al. | 455/118 |
| 7,764,935 B2 * | 7/2010 | Pallonen et al. | 455/115.1 |
| 7,889,123 B1 * | 2/2011 | Warloe | 342/357.62 |
| 2001/0051511 A1 * | 12/2001 | Kakizaki et al. | 455/116 |
| 2002/0080890 A1 * | 6/2002 | Kaczynski | 375/297 |
| 2004/0185807 A1 * | 9/2004 | Ramachandran | 455/127.1 |
| 2007/0058748 A1 * | 3/2007 | Kim et al. | 375/295 |
| 2007/0099580 A1 * | 5/2007 | Hosokawa et al. | 455/76 |
| 2009/0036069 A1 * | 2/2009 | Seckin et al. | 455/118 |
| 2009/0198992 A1 * | 8/2009 | Rofougaran | 713/2 |
| 2010/0237945 A1 * | 9/2010 | Cassia et al. | 330/277 |
| 2012/0007580 A1 * | 1/2012 | Kim | 324/74 |

* cited by examiner

*Primary Examiner* — Ankur Jain
(74) *Attorney, Agent, or Firm* — McDermott Will & Emery LLP

(57) ABSTRACT

A transmitter RF front-end integrated on a single substrate is enabled to determine whether associated IF amplification stage provides a required transmission gain for transmitting an output signal of an application. A dedicated power amplifier driver within the transmitter RF front-end is configured to provide additional gain, when needed based on the determination, to meet the required transmission gain for transmitting the output signal. The associated IF amplification stage comprises an upconversion mixer and a lowpass filter (LPF). The upconversion mixer may be implemented as an active mixer or a passive mixer. The upconversion mixer and the dedicated power amplifier driver are enabled to operate in 2.44 gigahertz. A maximum gain provided by the associated intermediate frequency (IF) amplification stage for transmitting the output signal is determined to decide the additional gain provided by the dedicated power amplifier driver by comparing with the required transmission gain.

19 Claims, 5 Drawing Sheets

METHOD AND SYSTEM FOR A DYNAMIC TRANSMISSION GAIN CONTROL USING A DEDICATED POWER AMPLIFIER DRIVER IN A RADIO FREQUENCY TRANSMITTER

CROSS-REFERENCE TO RELATED APPLICATIONS/INCORPORATION BY REFERENCE

Not applicable.

FIELD OF THE INVENTION

Certain embodiments of the invention relate to communication systems. More specifically, certain embodiments of the invention relate to a method and system for a dynamic transmission gain control using a dedicated power amplifier driver in a radio frequency transmitter.

BACKGROUND OF THE INVENTION

A wireless transmitter transmit wireless signals via a wireless medium and a wireless communication device comprising a receiver is operable to receive and recover the transmitted wireless signals from the wireless medium. The transmitted wireless signals may be distorted and/or otherwise degraded during transmission over the wireless medium. The distortion and/or degradation may occur as a result of factors comprising channel impairments such as noise, signal interference, intersymbol interference and co-channel interference. Accordingly, the transmitter is generally operable to code and/or otherwise process information contained in the transmitted wireless signals so as to mitigate the effects of any actual and/or perceived channel impairments.

The structure of the wireless transmitter and/or wireless transmitted signals is dependent upon the wireless communication standard being supported by the wireless communication device comprising the wireless transmitter and/or wireless receiver. For example, IEEE 802.11a defines an orthogonal frequency division multiplexing (OFDM) wireless transmission protocol that comprise eight 20 MHz spaced channels in the lower band (e.g., 5.15 gigahertz to 5.35 gigahertz) and four 30 MHz spaced channels in the upper band (e.g., 5.725 gigahertz to 5.825 gigahertz). Measurement and control of RF power is a critical consideration when designing a wireless transmitter. Various factors such as, for example, regulatory requirements on power transmitted, network robustness, and the need to co-exist with other wireless networks, demand that there be tight control of transmitted power. Moreover, precise RF power control can result in improved spectral performance and can save cost and energy in the transmitter's power amplifier.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for a dynamic transmission gain control using a dedicated power amplifier driver in a radio frequency transmitter, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a dynamic transmission gain control using a dedicated power amplifier driver in a radio frequency transmitter. In accordance with various embodiments of the invention, a transmitter RF front-end is integrated on a single substrate and/or a chip. The transmitter RF front-end is enabled to determine whether an associated IF amplification stage is able to provide a required transmission gain for transmitting an output signal. The signal to be transmitted may comprise a baseband signal. A dedicated power amplifier driver may be configured to provide additional gain, when needed based on the determination, to meet the required transmission gain for transmitting the output signal. The associated IF amplification stage comprises an upconversion mixer and a lowpass filter (LPF). The upconversion mixer may be implemented as an active mixer or a passive mixer. The upconversion mixer may be enabled to operate in various operating frequencies such as 2.44 gigahertz. The DPAD may be enabled to operate in the same operating frequency of the upconversion mixer. The transmitter RF front-end may be enabled to determine a maximum gain provided by the associated intermediate frequency (IF) amplification stage to transmit the received baseband signal. The determined maximum gain may be compared with the required transmission gain so as to determine the additional gain that the DPAD may need to provide. In instances where the determined maximum gain may be greater than or equal to the required transmission gain of the application, only the associated intermediate frequency (IF) amplification stage may be required to provide the required gain of the application to drive a power amplifier of the transmitter RF front-end. In instances where the determined maximum gain may be less than the required transmission gain, the DPAD and the associated intermediate frequency (IF) amplification stage may be enabled to provide the required gain to drive the power amplifier of the transmitter RF front-end.

Figure 1A:
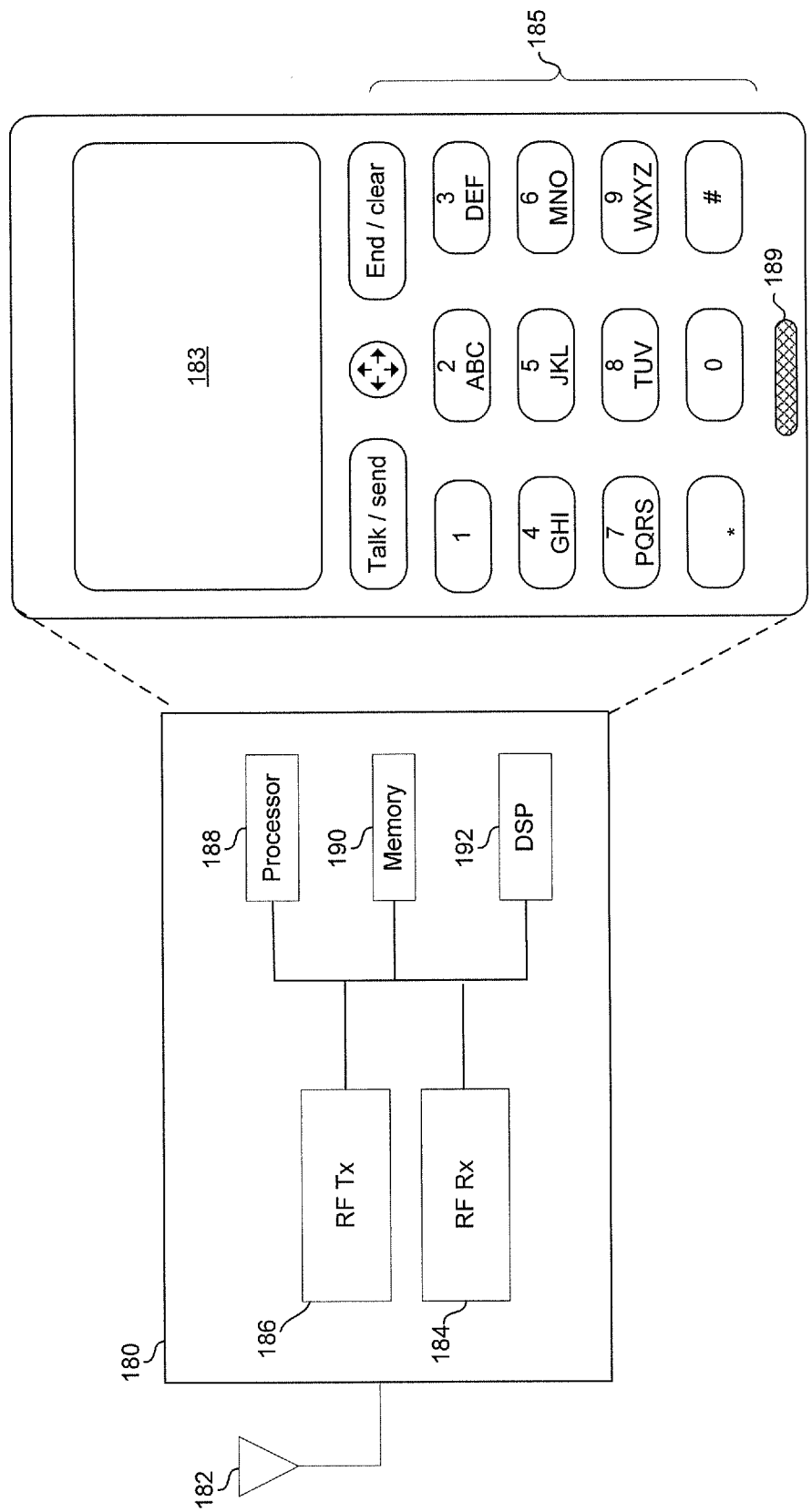
FIG. 1A is a block diagram of an exemplary communication device that utilizes a dedicated power amplifier driver in a radio frequency (RF) transmitter, in accordance with an embodiment of the invention.

FIG. 1A is a block diagram of an exemplary communication device that utilizes a dedicated power amplifier driver in a radio frequency (RF) transmitter, in accordance with an embodiment of the invention. Referring to FIG. 1, there is shown a communication device 180 comprising an antenna 182, a radio frequency (RF) receiver (Rx) 184, a radio frequency (RF) transmitter (Tx) 186, a processor 188, a memory 190, a DSP 192, a display 183, user controls 185, a speaker 187, and a microphone 189.

The antenna 182 may be operable for transmitting and/or receiving electromagnetic signals. Although a single antenna is illustrated, the invention is not so limited. In this regard, the RF Tx/Rx 184 may utilize a common antenna for transmission and reception of signals adhering to one or more wireless standards, may utilize different antennas for each supported wireless standard, and/or may utilize a plurality of antennas for each supported wireless standard.

The RF Rx 184 may comprise suitable logic circuitry and/or code that may be operable to receive data utilizing one or more wired, wireless, and/or optical standards. In various exemplary embodiments of the invention, the RF Rx 184 may be operable to communicate in adherence with cellular, WiMAX, Wi-Fi, Bluetooth, Zigbee, T1/E1, Ethernet, USB, IEEE 1394, analog audio standards, analog video standards, digital audio standards, and/or digital video standards. The radio RF Rx 184 may be operable to perform amplification, down-conversion, filtering, demodulation, and analog to digital conversion of received signals.

The RF Tx 186 may comprise suitable logic circuitry and/or code that may be operable to transmit data utilizing one or more wired, wireless, and/or optical standards. In various exemplary embodiments of the invention, the RF Tx 186 may be operable to communicate in adherence with cellular, WiMAX, Wi-Fi, Bluetooth, Zigbee, T1/E1, Ethernet, USB, IEEE 1394, analog audio standards, analog video standards, digital audio standards, and/or digital video standards. The radio RF Tx 186 may be operable to perform amplification, up-conversion, filtering, modulation, and digital to analog conversion of signals to be transmitted. In this regard, the RF Tx 186 may be enabled to perform a high resolution transmit gain control and a coarse transmit gain control. The RF Tx 186 may be enabled to utilize existing transmitter intermediate frequency (IF) section for the high resolution gain control and perform the coarse gain control via a dedicated power amplifier driver.

The processor 188 may comprise suitable logic, circuitry, and/or code that may enable processing data and/or controlling operations of the communication device 180. In this regard, the processor 188 may be enabled to provide control signals to the various other portions comprising the communication device 180. The processor 188 may also control transfers of data between various portions of the communication device 180. Additionally, the processor 188 may enable execution of applications programs and/or code for processing data and effectuating operation of the communication device 180.

The memory 190 may comprise suitable logic, circuitry, and/or code that may enable storage or programming of information comprising parameters and/or code that may effectuate the operation of the communication device 180. Stored information may comprise received data and/or data to be presented, transmitted, and/or otherwise processed. The parameters may comprise configuration data and the code may comprise operational code such as software and/or firmware, but the information need not be limited in this regard.

The DSP 192 may comprise suitable logic, circuitry, and/or code operable to perform computationally intensive processing of data. In various embodiments of the invention, the DSP 192 may encode, decode, transcode, modulate, demodulate, encrypt, decrypt, scramble, descramble, and/or otherwise process data.

The display 183 may be operable to provide visual information to, and/or enable interaction by, a user of the communication device 180. In various embodiments of the invention, a graphical user interface may be presented via the display 183. In various embodiments of the invention, a visual media content such as video, images, and text may be presented via the display 183.

The user controls 185 may be operable to enable user interaction with the communication device 180 to control services and/or content handled by the communication device 180. The user controls 185 may comprise, for example, a keypad, a keyboard, a roller ball, a multidirectional button, a scroll wheels, and/or a touch screen.

The speaker 187 may be operable to present audio information to a user. The speaker may present voice from a phone call and/or music or ringtones played back by the cellular enabled communication device.

The microphone 189 may be operable to convert acoustic signals into electronic signals. The microphone may enable a user to participate in a phone call and/or interact with the cellular enabled communication device via oral input.

In an exemplary operation, the RF Tx 186 may be enabled to process digital baseband data, and output to the processor 188, the memory 190, and/or the DSP 192. The digital baseband data may be processed by the processor 188, the memory 190, and/or the DSP 192 to be transmitted to a target receiver. In this regard, a particular transmit power may be adjusted by using existing transmitter intermediate frequency (IF) section and/or a dedicated power amplifier driver based on a required transmission gain required.

Figure 1B:
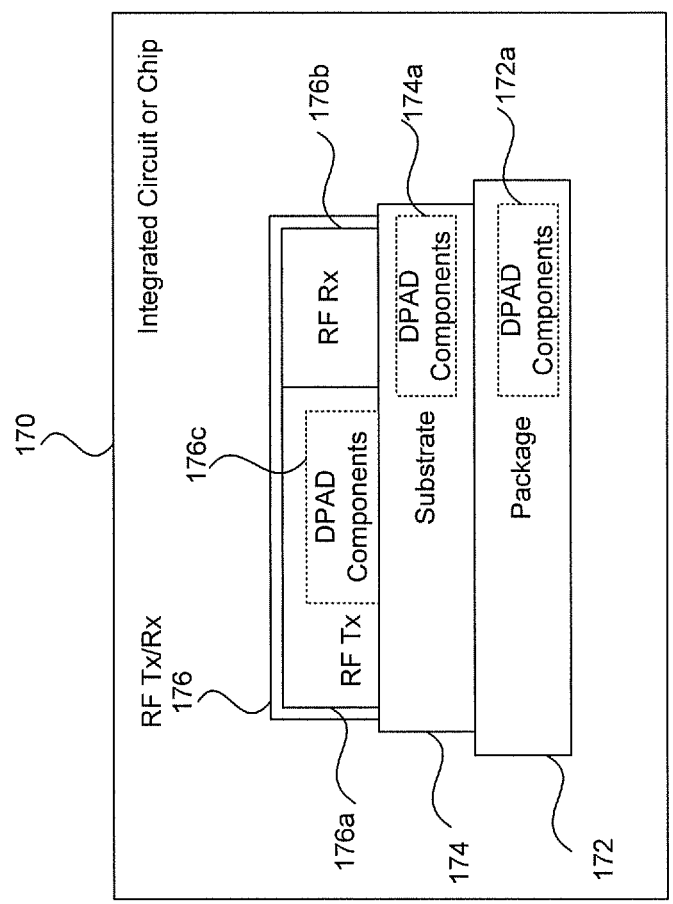
FIG. 1B is a block diagram of an exemplary layout of a RF transmitter integrated on a single substrate, in accordance with an embodiment of the invention.

FIG. 1B is a block diagram of an exemplary layout of a RF transmitter integrated on a single substrate, in accordance with an embodiment of the invention. Referring to FIG. 1B, there is shown an integrated circuit or chip 170. The integrated circuit or chip 170 may comprise a package layer 172, a substrate layer 174, and a RF Tx/Rx layer 176, respectively.

The package layer 172 may comprise a plurality of circuit components such as capacitors, resistors, inductors, and/or switches. At least a portion of the plurality of circuit components of package layer 172 may be utilized for a dedicated power amplifier driver (DPAD) to provide transmission power to meet a required transmission gain for transmitting a signal. In this regard, the DPAD components 172a of the package layer 172 may be configurable circuit components to provide the required transmission gain together with corresponding circuit components utilized for transmissions in an intermediate frequency (IF) band.

The substrate layer 174 may be designed with a p-type substrate and/or an n-type substrate. The plurality of circuit components of the package layer 172 may be assembled onto to the substrate layer 174 to form an extremely compact, highly integrated, multi-component package or system-in-package. In this regard, at least a portion of the assembled circuit components of the package layer 172 may be utilized for a dedicated power amplifier driver (DPAD) to provide transmission power to meet a required transmission gain for transmitting a signal. In this regard, the DPAD components 174a of the substrate layer 174 may be configurable to provide the required transmission gain together with corresponding components utilized for transmissions in an intermediate frequency (IF) band.

The RF Tx/Rx layer 176 may comprise an integrated radio circuit on the substrate layer 174. The Tx/Rx layer 176 may comprise a RF Tx 176a and a RF Rx 176b. The RF Tx 176a may be operable to perform various RF signal transmission functions such as, for example, amplification, up-conversion, filtering, modulation, and digital to analog conversion of signals to be transmitted. In this regard, at least a portion of the integrated radio circuit on the substrate layer 174 may be utilized for the dedicated power amplifier driver (DPAD) to provide transmission power to meet a required transmission gain for transmitting a signal. In this regard, the DPAD components 176c of the RF Tx/Rx layer 176 may be configurable to provide the required transmission gain together with corresponding components utilized for transmissions in an intermediate frequency (IF) band. The RF Rx 176b may be operable to perform various RF signal receiving functions such as, for example, amplification, down-conversion, filtering, demodulation, and analog to digital conversion of signals to be received. Although a single substrate for the RF Tx 176a and the RF Rx 176b is illustrated, the invention is not so limited. In this regard, the RF Tx 176a and the RF Rx 176b may utilize different substrate for transmission and reception of signals, respectively, adhering to one or more wireless standards.

Figure 2:
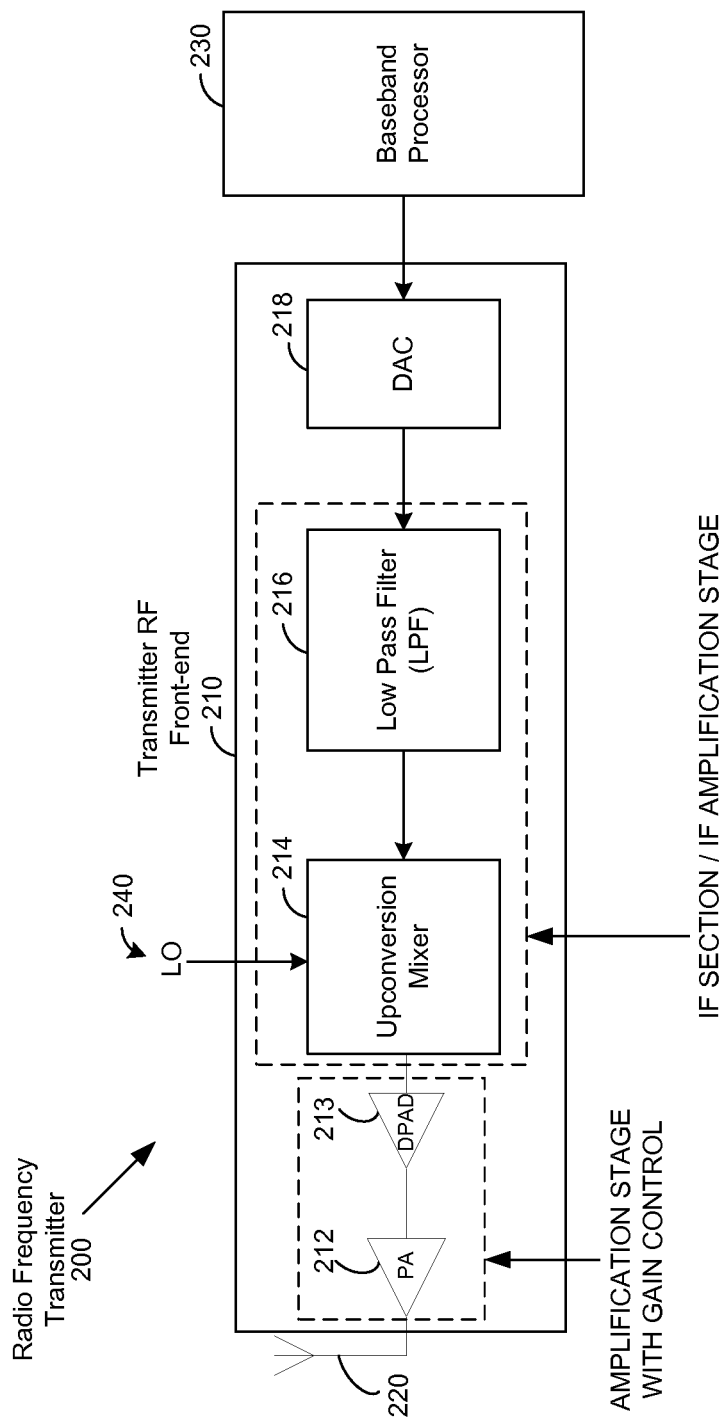
FIG. 2 is a diagram illustrating an exemplary radio frequency (RF) transmitter that utilizes a dedicated power amplifier driver for gain control, in accordance with an embodiment of the invention.

FIG. 2 is a diagram illustrating an exemplary radio frequency (RF) transmitter that utilizes a dedicated power amplifier driver for gain control, in accordance with an embodiment of the invention. Referring to FIG. 2, there is shown a radio frequency transmitter 200 comprising a transmitter RF front-end 210, an antenna 220, a baseband processor 230, and a local oscillator (LO) 240. The transmitter RF front-end 210 comprises a power amplifier 212, a dedicated power amplifier driver 213, an upconversion mixer 214, a lowpass filter 216, and digital-to-analog converter (DAC) 218.

The transmitter RF front-end 210 110 may comprise suitable logic, circuitry, and/or code that may be operable to process outbound RF signals and transmit them to a target receiver via the antenna 220. The transmitter RF front-end 210 may enable conversion of digital baseband signals from the baseband processor 230 to corresponding RF signals to be amplified via the PA 212 for transmission.

The DAC 218 may comprise suitable logic, circuitry and/or code that may be operable to convert received digital baseband signals from the baseband processor 230 to baseband analog signals. The baseband analog signals may be communicated with the LPF 216, which is operable to perform lowpass filtering the baseband analog signals.

The LPF 216 may comprise suitable logic, circuitry and/or code that may be enabled to suppress intermediate frequency spurious on the outputs of the DAC 218. The LPF 216 may be operable to reduce sideband components in the outputs of the DAC 218. The outputs of the LPF 216 may be communicated with the upconversion mixer 214.

The upconversion mixer 214 may comprise suitable logic, circuitry and/or code that may be operable to translate the resulted signals from the LPF 216 to transmit frequency signals in conjunction with the local oscillator (LO) 240. The upconversion mixer 214 may be implemented as an active upconversion mixer or a passive upconversion mixer. An active implementation of the upconversion mixer 214 may be preferred when a conversion gain may be required. A passive implementation of the upconversion mixer 214 may generally attenuate signal amplitude when translating intermediate frequency (IF) signals to radio frequency (RF) signals. However, the passive implementation of the upconversion mixer 214 may enable a reduction of chip area and/or power consumption of the transmitter RF front-end. The transmit frequency signals from the upconversion mixer 214 may be communicated with the power amplifier (PA) 212 via the dedicated power amplifier 213.

The dedicated power amplifier driver (DPAD) 213 may comprise suitable logic, circuitry and/or code that may be enabled to provide required gain to drive the PA 212 for a particular application such as a 10 dB application in 2.44 gigahertz. Typically, the DPAD 213 may be dedicated to those particular applications which may not be supported via merely using the LPF 216 and the upconversion mixer 214.

The PA 212 may comprise suitable logic, circuitry and/or code that may be enabled to amplify signals for transmission. The PA 212 may be driven by using associated transmit IF section comprising the LPF 216 and the upconversion mixer 214. In instances where a gain provided by the transmit IF section may not be enough to support a particular application such as a 10 dB application in 2.44 gigahertz, the DPAD 213 may be enabled to provide an additional required gain to drive the PA 212 for the particular application.

The antenna 220 may comprise suitable logic, circuitry and/or code that may be operable to receive and transmit signals in radio frequency (RF) bands. Although the single antenna 220 is illustrated in FIG. 2, the invention may not be so limited. Accordingly, one or more antennas may be utilized for receiving and/or transmitting signals in radio frequency (RF) bands by the radio transceiver 100 without departing from the spirit and scope of various embodiments of the invention.

The baseband processor 230 may comprise suitable logic, circuitry and/or code that may be operable to process digitized baseband signals. The baseband processor 230 may be enabled to perform exemplary operations comprising demodulation, decorrelation, decoding, and error correction. In the event that the digitized baseband signals are to be transmitted, the baseband processor 230 may be enabled to communicate with the transmitter RF front-end 210 to transmit corresponding signals via the antenna 220.

In an exemplary operation, in instances where the baseband processor 230 may need to transmit digitized baseband signals in a specific frequency band, the baseband processor 230 may communicate the digitized baseband signals to the DAC 218. The DAC 218 may be enabled to convert the received digitized baseband signals to corresponding baseband analog signals. The corresponding baseband analog signals may be communicated to the low pass filter (LPF) 216 of the IF section. The LPF 216 may be enabled to filter the corresponding baseband analog signals and suppress sideband components in the received baseband analog signals and communicate to the upconversion mixer 214 of the IF section. The upconversion mixer 214 may be enabled to mix the received baseband analog signals with upconversion signals to convert the received baseband analog signals to radio frequency signals.

The converted baseband analog signals may be communicated to the PA 212 via the DPAD 213. The DPAD 213 may be enabled to provide a required gain together with the LPF 216 and the upconversion mixer 214 in the IF section to drive the PA 212 for a particular application. The converted baseband analog signals may be amplified at the PA 212 and communicated to the antenna 220 for transmission.

Figure 3:
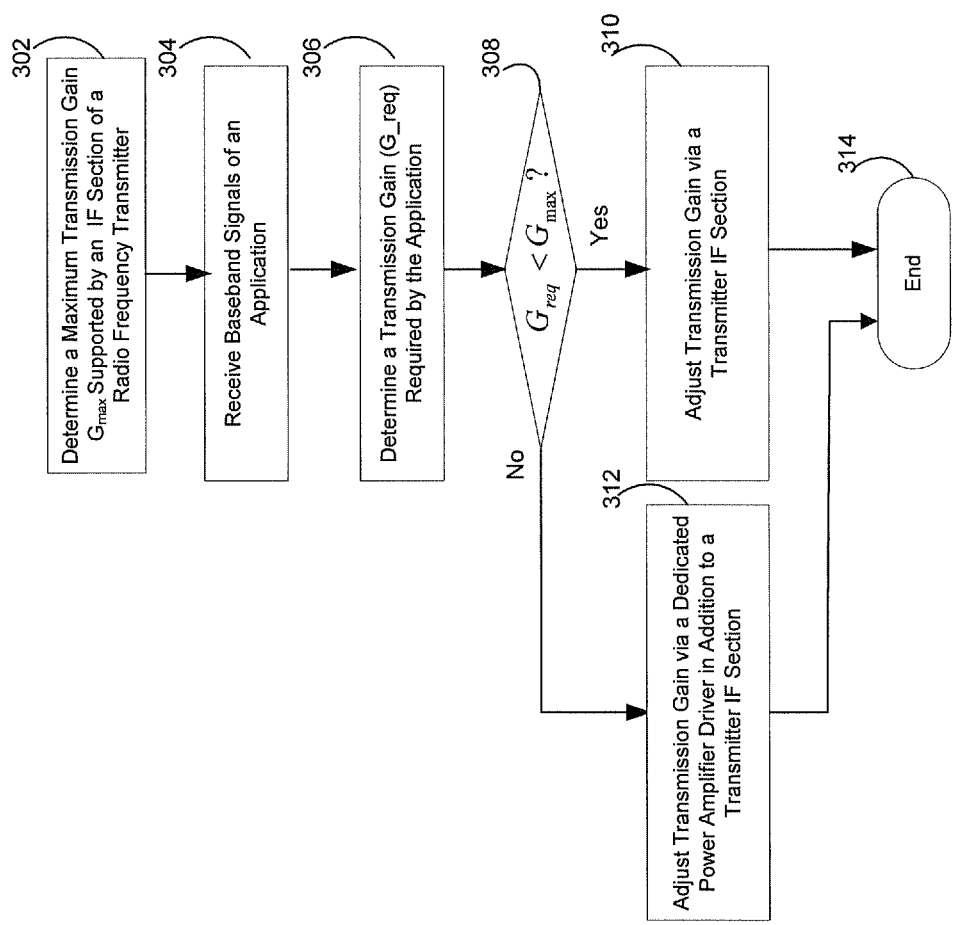
FIG. 3 is a flow chart illustrating an exemplary transmission gain control procedure using a dedicated power amplifier driver, in accordance with an embodiment of the invention.

FIG. 3 is a flow chart illustrating an exemplary transmission gain control using a dedicated power amplifier driver, in accordance with an embodiment of the invention. Referring to FIG. 3, the exemplary steps start with the step 302. In step 302, a maximum transmission gain ($G_{max}$) supported by the LPF 216 and the upconversion mixer 214 in the transmitter IF section of the RF transmitter 200 may be determined. In step 304, the transmitter RF front-end 210 may receive baseband signals from the baseband processor 230.

In step 306, a transmission gain required by the particular application may be determined by the baseband processor 230. In step 308, it may determine whether the determined transmission gain required by the particular application is less than the determined maximum transmission gain ($G_{max}$) supported by the LPF 216 and the upconversion mixer 214 in the transmitter IF section of the RF transmitter 200. In instances where the determined transmission gain required by the particular application is less than the determined maximum transmission gain ($G_{max}$) supported by the LPF 216 and the upconversion mixer 214 in the transmitter IF section of the RF transmitter 200, then in step 310, a transmission gain of the receive baseband signals of the particular application is adjusted only via the LPF 216 and the upconversion mixer 214 in the transmitter IF section of the RF transmitter 200. The exemplary process ends in step 314.

In step 308, in instances where the determined transmission gain required by the particular application is equal or greater than the determined maximum transmission gain ($G_{max}$) supported by the LPF 216 and the upconversion mixer 214 in the transmitter IF section of the RF transmitter 200, then in step 312, a transmission gain of the receive baseband signals of the particular application is adjusted via the DPAD 213 in addition to the LPF 216 and the upconversion mixer 214 in the transmitter IF section of the RF transmitter 200. The exemplary process ends in step 314.

Figure 4:
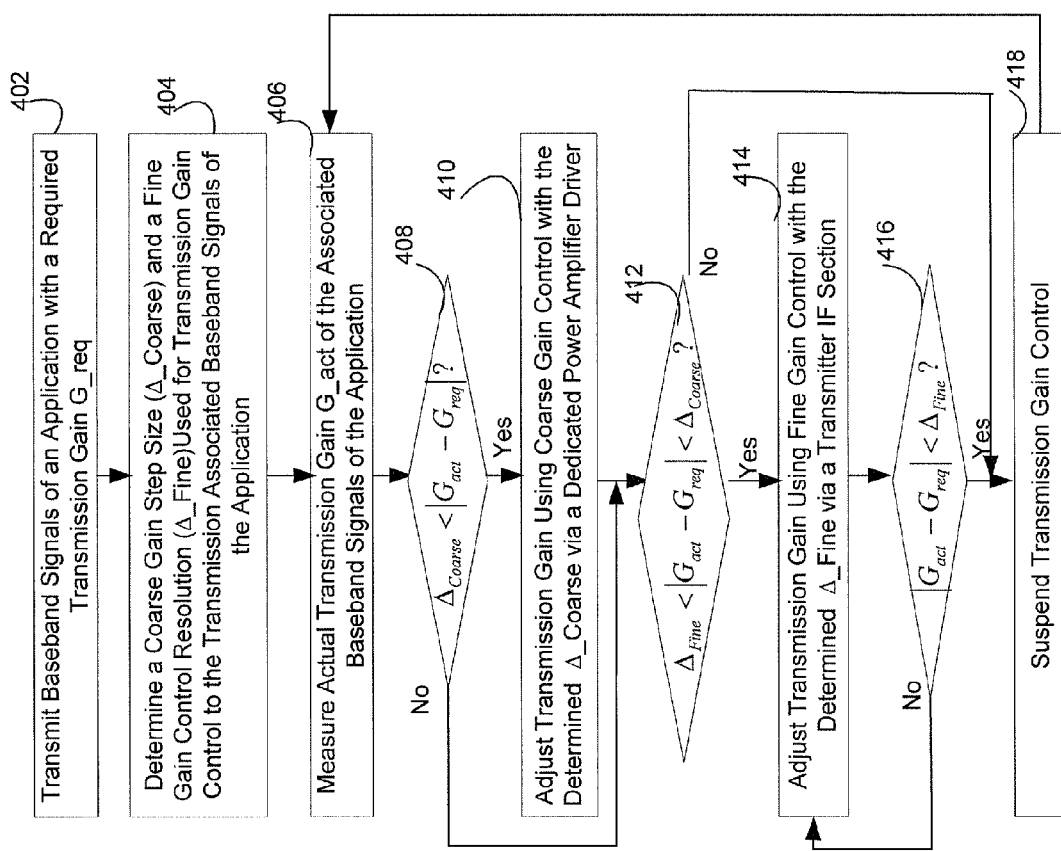
FIG. 4 is a flow chart illustrating an exemplary dynamic transmission gain control procedure, in accordance with an embodiment of the invention.

FIG. 4 is a flow chart illustrating an exemplary dynamic transmission gain control procedure, in accordance with an embodiment of the invention. Referring to FIG. 4, the exemplary steps start with the step 402. In step 402, the RF transmitter 200 may be operable to transmit baseband signals of an application. Parameter G_req is a required transmission gain and parameter G_req is a required transmission gain or a required transmission power of the application. In step 404, the RF transmitter 200 may be operable to determine a coarse gain step size (Δ_Coarse) and a fine gain control resolution (Δ_Fine), which may be used in the transmission gain control of baseband signals of the application. In step 406, actual transmission gain (G_act) of the baseband signals of the application may be measured. In step 408, it may be determined whether or not the difference between the measured actual transmission gain (G_act) and the required transmission gain (G_req) of the application may be greater than the determined coarse gain step size of Δ_Coarse. In instances where the difference between the measured actual transmission gain (G_act) and the required transmission gain G_req of the application is greater than the determined coarse gain step size of Δ_Coarse, then in step 410, the RF transmitter 200 may be operable to adjust transmission gain using a coarse gain control via the DPAD 213. The transmission gain is adjusted in the determined coarse gain step size of Δ_Coarse.

In step 412, it may be determined whether or not the difference between the measured actual transmission gain (G_act) and the required transmission gain (G_req) of the application may be less than the determined coarse gain step size of Δ_Coarse but greater than the determined fine gain control resolution of Δ_Fine. In instances where the difference between the measured actual transmission gain (G_act) and the required transmission gain (G_req) of the application is less than the determined coarse gain step size of Δ_Coarse but greater than the determined fine gain control resolution of Δ_Fine, then in step 414, where the RF transmitter 200 may be operable to adjust transmission gain using a fine gain control via the associated transmit IF section comprising the LPF 216 and the upconversion mixer 214. The transmission gain is adjusted in the determined fine gain control resolution of Δ_Fine. In step 416, it may be determined whether the difference between the measured actual transmission gain (G_act) and the required transmission gain (G_req) of the application may be less than the determined fine gain control resolution of Δ_Fine. In instances where the difference between the measured actual transmission gain (G_act) and the required transmission gain (G_req) of the application is less than the determined fine gain control resolution of Δ_Fine, then in step 418, where the RF transmitter 200 may be operable to suspend transmission gain control on the transmission of the baseband signals of the application. The exemplary steps may return to step 406.

In step 408, in instances where the difference between the measured actual transmission gain (G_act) and the required transmission gain (G_req) of the application is not greater than the determined coarse gain step size of Δ_Coarse, then the exemplary steps continue in step 412.

In step 412, in instances where the difference between the measured actual transmission gain (G_act) and the required transmission gain (G_req) of the application is not in the range between the determined fine gain control resolution of Δ_Fine and the determined coarse gain step size of Δ_Coarse, then the exemplary steps continue in step 418.

In step 416, in instances where the difference between the measured actual transmission gain (G_act) and the required transmission gain (G_req) of the application is not less than the determined fine gain control resolution of Δ_Fine, then the exemplary steps may return to step 414.

Aspects of a method and system for a dynamic transmission gain control using a dedicated power amplifier driver in a radio frequency transmitter are provided. In accordance with various embodiments of the invention, the transmitter RF front-end 210 is integrated on a single substrate such as the substrate layer 174. In this regard, the transmitter RF front-end 210 may be integrated within a single chip. As described with respect to FIG. 1 through FIG. 3, the transmitter RF front-end 210 may be enabled to determine whether associated IF amplification stage may be able to provide a required transmission gain for transmitting an output signal. The signal to be transmitted may be a baseband signal.

The DPAD 213 may be configured to provide additional gain, when needed based on the determination, to meet the required transmission gain for transmitting the output signal. The associated IF amplification stage comprises the upconversion mixer 214 and the LPF 216. The upconversion mixer 214 may be an active mixer for a conversion gain or a passive mixer to reduce chip area and/or power consumption of the transmitter RF front-end 210. The upconversion mixer 214 may be enabled to operate in various operating frequencies such as 2.44 gigahertz. The DPAD 213 may be enabled to operate in the same operating frequency such as 2.44 gigahertz of the upconversion mixer 214.

In the event that the baseband signal is received from the baseband processor 230, the transmitter RF front-end 210 may be enabled to determine a maximum gain that the associated intermediate frequency (IF) amplification stage may provide for transmitting the received baseband signal. The determined maximum gain may be compared with the required transmission gain of the application to determine the additional gain that the DPAD 213 may need to provide. As described with respect to FIG. 3 and FIG. 4, in instances where the determined maximum gain may be greater than or equal to the required transmission gain, only the associated intermediate frequency (IF) amplification stage may be required to provide the required gain of the application to drive the PA 212. In instances where the determined maximum gain may be less than the required transmission gain of the application, the DPAD 213 and the associated intermediate frequency (IF) amplification stage may be enabled to provide the required gain to drive the PA 212.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for a dedicated power amplifier driver in a radio frequency transmitter.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for communication, the method comprising:
   in a radio frequency transmitter front-end integrated on a single substrate:
   determining a maximum transmission gain supported by a transmitter intermediate frequency (IF) section;
   receiving an output signal from a baseband processor in communication with said radio frequency transmitter front-end;
   determining a required transmission gain for a transmission of said output signal in an IF amplification stage;
   responsive to said required transmission gain being less than said maximum transmission gain, adjusting a transmission gain of said output signal for said transmission only by at least a portion of components of said transmitter IF section; and
   responsive to said required transmission gain being greater than or equal to said maximum transmission gain:
      configuring a power amplifier driver to provide additional gain to meet said required transmission gain for said transmission of said output signal, and
      adjusting a transmission gain of said output signal for said transmission by at least said portion of components of said transmitter IF section.

2. The method according to claim 1, wherein said IF amplification stage comprises a transmitter lowpass filter and an upconversion mixer.

3. The method according to claim 2, wherein said upconversion mixer is a passive mixer.

4. The method according to claim 2, wherein said upconversion mixer is an active mixer.

5. The method according to claim 2, wherein said upconversion mixer operates in a 2.44 gigahertz frequency band.

6. The method according to claim 1, wherein said power amplifier driver operates in a 2.44 gigahertz frequency band.

7. The method according to claim 1, comprising determining a maximum gain that said IF amplification stage provides for transmitting said output signal.

8. The method according to claim 7, comprising determining said additional gain based at least in part on said determined maximum gain.

9. A system for communication, the system comprising:
   one or more circuits comprising a radio frequency transmitter front-end and a power amplifier driver, wherein:
   said one or more circuits are integrated on a single substrate; and
   said one or more circuits are operable to:
      determine a maximum transmission gain supported by a transmitter intermediate frequency (IF) section;
      receive an output signal from a baseband processor in communication with said radio frequency transmitter front-end;
      determine a required transmission gain for transmission of said output signal in an IF amplification stage;
      responsive to said required transmission gain being less than said maximum transmission gain, adjust a transmission gain of said output signal for said transmission by at least a portion of components of said transmitter IF section; and
      responsive to said required transmission gain being greater than or equal to said maximum transmission gain:
         configure said power amplifier driver to provide additional gain to meet said required transmission gain for said transmission of said output signal, and
         adjust a transmission gain of said output signal for said transmission by at least said portion of components of said transmitter IF section.

10. The system according to claim 9, wherein said one or more circuits comprises a transmitter lowpass filter and an upconversion mixer, and said IF amplification stage comprises said transmitter lowpass filter and said upconversion mixer.

11. The system according to claim 10, wherein said upconversion mixer is a passive mixer.

12. The system according to claim 10, wherein said upconversion mixer is an active mixer.

13. The system according to claim 10, wherein said upconversion mixer operates in a 2.44 gigahertz frequency band.

14. The system according to claim 9, wherein said power amplifier driver operates in a 2.44 gigahertz frequency band.

15. The system according to claim 9, wherein said one or more circuits are operable to determine a maximum gain that said IF amplification stage provides for transmitting said output signal.

16. The system according to claim 15, wherein said one or more circuits are operable to determine said additional gain based at least in part on said determined maximum gain.

17. A system for communication, the system comprising:
a radio frequency transmitter front-end integrated on a single substrate, wherein the radio frequency transmitter front-end comprises:
- a transmitter intermediate frequency (IF) section comprising at least a low pass filter in communication with an upconversion mixer, the upconversion mixer configured to translate a signal from the low pass filter in association with a local oscillator for a transmission, the low pass filter and the upconversion mixer configured to adjust a transmission gain of the signal responsive to a required transmission gain determined for the signal being less than a maximum transmission gain supported in an IF amplification stage;
- a dedicated power amplifier driver in communication with the upconversion mixer, the dedicated power amplifier driver configured to provide an additional gain to meet the required transmission gain for the transmission of the signal responsive to the required transmission gain being greater than or equal to the maximum transmission gain, and
- a baseband processor in communication with the radio frequency transmitter front-end, the radio frequency transmitter front-end configured to convert a digital baseband signal from the baseband processor to the signal.

18. The system according to claim 17, wherein the baseband processor is configured to perform demodulation, decorrelation, decoding, or error correction.

19. The system according to claim 17, wherein the baseband processor is configured to communicate with the radio frequency transmitter front-end to transmit the signal via the antenna.

* * * * *